United States Patent [19]

Imamura

[11] 4,447,894

[45] May 8, 1984

[54] SEMICONDUCTOR MEMORY DEVICE
[75] Inventor: Yoichi Imamura, Suwa, Japan
[73] Assignee: Kabushiki Kaisha Suwa Seikosha, Tokyo, Japan
[21] Appl. No.: 334,621
[22] Filed: Dec. 28, 1981
[30] Foreign Application Priority Data Dec. 29, 1980 [JP] Japan .................................. 55-188141

[51] Int. Cl.³ ............................................. G11C 11/40
[52] U.S. Cl. ...................................... 365/219; 365/154
[58] Field of Search ............... 179/154, 156, 189, 190, 179/202, 219, 230

[56] References Cited

U.S. PATENT DOCUMENTS 4,122,541  10/1978  Uchida ................................ 365/154

*Primary Examiner*—Joseph A. Popek
*Attorney, Agent, or Firm*—Blum, Kaplan, Friedman, Silberman and Beran

[57] ABSTRACT

Generally speaking, in accordance with the invention, a semiconductor memory device comprises a static RAM cell having a serial-parallel data conversion function, formed of seven transistors. The RAM can read/write and includes bit lines exclusively for reading and bit lines which are exclusively for writing the data. Data is read through the bit lines for exclusive reading by means of a single gate transistor. The semiconductor memory device provides a memory whose area is small in spite of including therein a serial-parallel conversion function. Further, access to the memory cell is freely available from the system side.

11 Claims, 2 Drawing Figures

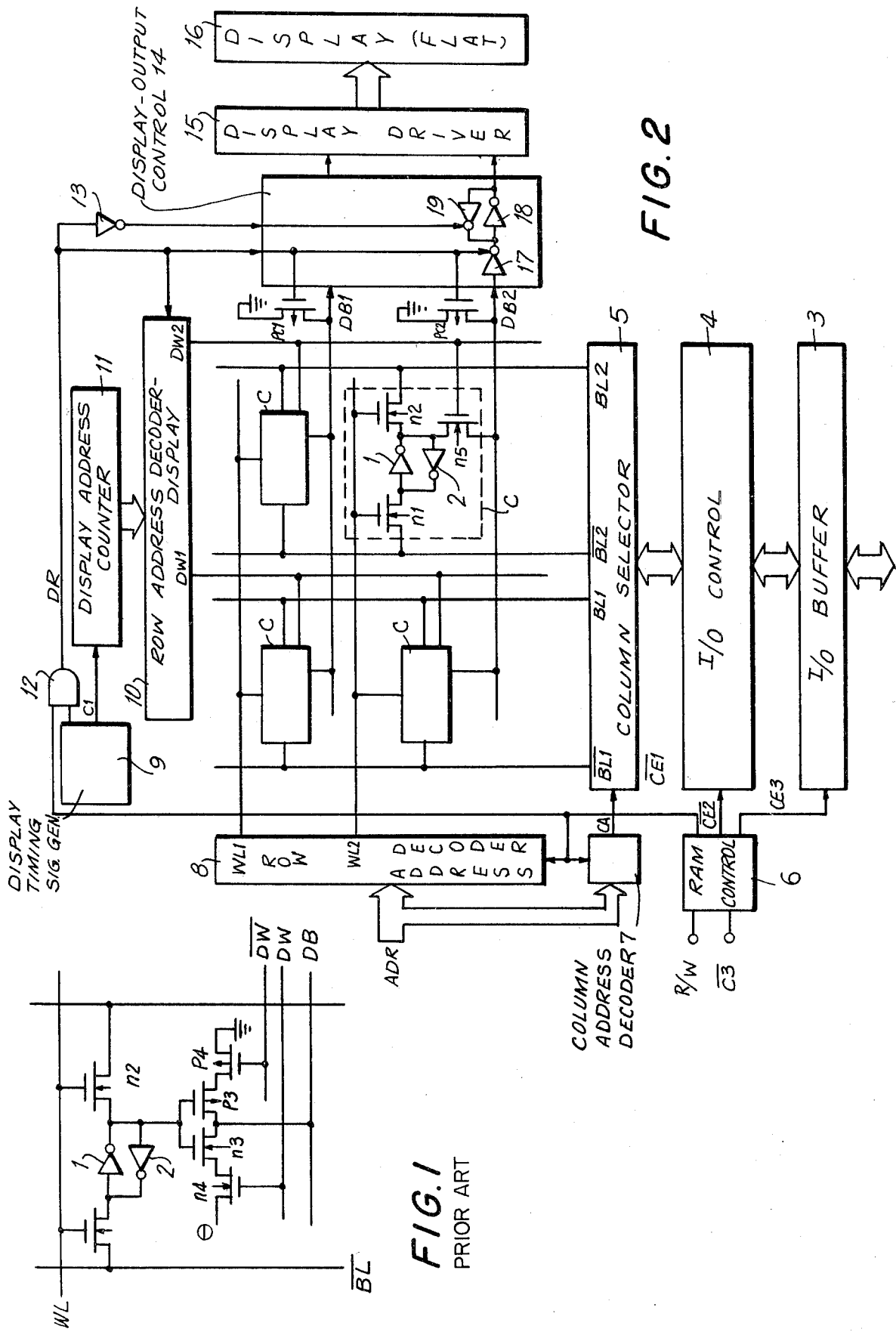

SEMICONDUCTOR MEMORY DEVICE

BACKGROUND OF THE INVENTION

This invention relates generally to a semiconductor memory device suited for use in a display driver circuit for a matrix type display. In accordance with the prior art, there are two types of construction for a display driver. Namely, a display driver which has a random access memory (RAM) therein formed of ten elements, that is, transistors. As a result, circuit integration is low and it is difficult to construct a RAM of large capacity. In a second type of display driver, the display data is converted from serial to parallel in a peripheral portion of the circuit. The construction becomes complicated and it is impossible to access the refresh memory from the system side at free timing. Additionally, high speed data processing is necessary and it is difficult to reduce power consumption. Therefore, where portable equipment operating on batteries is concerned, it is difficult to enlarge the display capacity.

Presently, a line sequential scanning system is utilized for driving any flat type matrix displays, such as a liquid crystal display, plasma display, fluorescent display tube, electro-luminescent display, and the like. This is comparable to a dot sequential scanning system used with a cathode ray tube display. Therefore, in the signal side driving circuit for driving the above mentioned displays, display data of one-word unit, which is input from the system side comprising a central processing unit or a keyboard, is stored once in a refresh memory of the RAM type. It is necessary that the display data after being converted serial-parallel, be simultaneously supplied to many segment drivers in order drive the displays.

In the prior art, in order to convert serial-parallel, as stated above, it is necessary that the serial-parallel conversion circuit be comprised of both a shift register and a latch, provided outside of the refresh memory. Alternatively, the display data is converted serial-parallel at the same time of reading from the refresh memory by using a ten-transistor element RAMS cell (FIG. 1).

In a construction where the serial-parallel conversion is provided externally, the input/output circuit becomes complicated because the input/output circuit from the system side of the refresh memory, and the read circuit to the display side are in common. Additionally, at the time of reading to the display side, the input/output mode is restricted because access from the system side to the refresh memory is not possible.

On the other hand, when using a ten-element RAM cell, the number of elements and leads is large so that the area of the cell becomes large and it is impossible to form a large capacity RAM from the point of cost. Additionally, quickening the access time of the refresh memory is limited because the area of the cell is large.

What is needed is a semiconductor memory device of the RAM type which uses a reduced number of transistor elements and is readily integrated and accessed.

SUMMARY OF THE INVENTION

Generally speaking, in accordance with the invention, a semiconductor memory device comprises a static RAM cell having a serial-parallel data conversion function, formed of seven transistors. The RAM can read/write and includes bit lines exclusively for reading and bit lines which are exclusively for writing the data. Data is read through the bit lines for exclusive reading by means of a single gate transistor. The semiconductor memory device provides a memory whose area is small in spite of including therein a serial-parallel conversion function. Further, access to the memory cell is freely available from the system side.

Accordingly, it is an object of this invention to provide an improved semiconductor memory device providing serial-parallel conversion and ready access.

Another object of this invention is to provide an improved semiconductor memory device which uses a reduced number of transistor elements, is of small size and relatively integrated.

A further object of this invention is to provide an improved semiconductor memory device where independent data lines are provided for reading and writing.

Still other objects and advantages of the invention will in part be obvious and will in part be apparent from the specification.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is a circuit diagram of a ten-element random access memory (RAM) cell of the prior art; and FIG. 2 is a semi-schematic, functional block diagram of a display circuit having a seven-element random access memory (RAM) cell in accordance with the invention.

DESCRIPTION OF THE PREFERRED EMBODIMENTS

This invention relates to a static RAM semiconductor memory device adapted for reading through one gate transistor, selected by a second word selecting line. The memory functions for serial-parallel conversion of memory data. The second word selecting line for reading operates independently of a word selecting line for designating the memory address at the time of writing.

In the prior art, (FIG. 1) a ten-element RAM cell is formed of a six-element storage cell, a tri-state inverter for reading, and a third bit line DB which is connected to the output terminal of the tri-state inverter. The six-element storage cell is comprised of a bi-stable flip-flop including inverters 1,2 and gate transistors $n_1, n_2$, which transistors are selected by a signal on the word selecting line WL.

The tri-state inverter comprises transistors $n_4$ and $P_4$, and transistors $n_3$ and $P_3$. These transistors $n_3, P_3$, are switched by the opposite states of the second and third word selecting lines DW and $\overline{DW}$. Therefore, when using such a ten-element RAM cell (FIG. 1), the number of elements and the number of connections and leads are greater than those using only a six-element RAM cell. Thus, the area of the cell is enlarged and it is not possible to form a large capacity RAM from the point of view of cost. Additionally, quickening the access time of the refresh memory is limited because the area of the cell is large.

The disadvantages described above, are eliminated in the semiconductor memory device in accordance with the invention. The purpose of the semiconductor memory device of this invention is to provide a memory whose area of the memory cell is small despite having a serial-parallel conversion function in the memory device. Also, as described hereinafter, access from the system side is freely accomplished.

FIG. 2 is a semi-schematic functional block diagram of a display driving circuit which includes a semiconductor memory device of the RAM type including seven elements in accordance with the invention. Fundamental cells C are formed of seven elements and many cells C are arranged in a matrix format of rows and columns and form a RAM cell group. The display driving circuit also includes an input output (I/O) buffer 3, an input/output control circuit 4, a column selecting circuit 5, a RAM control circuit 6, a column address decoder 7, a row address decoder 8, a display timing signal generating circuit 9, and a row address decoder 10 for displaying. Also included are a display address counter 11, an output control circuit 14 for displaying, a display driver 15 and a flat-type matrix display 16.

Operation is now described for a construction where characters in a format of 5×7 dots are displayed with ten characters being possible in one row on the display 16. Display data of seven bits in a parallel format, the corresponding address ADR, a memory writing signal at the terminal R/W, and a chip selecting signal CS, are successively fed from the system side to the refresh memory. The seven-bit display data is decoded by a column scanning type character generator. Reading and writing from the system side to the refresh memory are the same operations as that of a conventional static RAM. Namely, the display data is input from the data bus by the input/output buffer 3 and is converted into the data for writing in the input/output control circuit 4. The converter data is selectively connected to the bit lines BL or $\overline{BL}$ by the column selecting circuit 5 in response to a signal CA fed from the column address decoder 7.

In addition, the gate transistors $n_1$ and $n_2$, which are N channel MOSFETS, are enabled to conduct in response to the signal WL fed from the row address decoder. The display data is written only in the cell wherein the bi-stable memory element is connected to the bit line BL or $\overline{BL}$. For the five by seven format, seven cells are simultaneously address designated. It is necessary that addresses be designated fifty times in total so as to write the data for ten characters in the five by seven matrix format for a row of ten characters.

On the other hand, when the data is read out from the refresh memory in order to drive the display, fifty memory cells are simultaneously selected by one address designation. In particular, the display address counter 11 receives a clock signal CL which is generated by the display timing circuit 9, and the display address counter generates the row address for linear sequential scanning. The row address is decoded by a row address decoder 10 for display, and one of the word selecting lines DW for display is driven.

In each cell C of the selected row the N-channel MOS transistor $n_5$ conducts for the selected memory cell, and the output potential of the inverter 1 which forms a bi-stable memory element is transmitted to the bit line DB for display. Any type of inverters are suitable for the inverters 1,2, for example, a CMOS inverter or an inverter of one side of a load resistance, and the like.

The bit line for displaying is previously precharged on the high side by a P-channel MOS transistor PC wherein the display data reading signal DR is a gate input. While the gate transistor $n_5$ is conducting, the precharged transistor PC2 is not conducting.

The potential of the bit line DB2 for displaying is retained by an output control circuit 14 for displaying until the display address is converted. The output control circuit 14 for displaying is formed of tri-state inverters 17,19 and the inverter 18. The output control circuit 14 uses the reading signal DR as a latch signal. In this construction, the tri-state inverter 17 also serves as a sense amplifier. The output from the output control circuit 14 for displaying is converted in voltage or in electric current by a display driver 15 and the display 16 is driven.

When the refresh memory is accessed (read or write) from the system side at the time of reading the display data, an AND gate 12 is immediately closed (a low output) by a chip enable signal CE 1 which is generated by the RAM control circuit 6. Then, the reading signal DR is placed in a standby condition. At this time, the address decoder for display 10 becomes non-selective due to the low reading signal DR and the gate transistor $n_5$ does not conduct. However, the data on the lines DB when the signal DR goes low is latched in the output control circuit 14 during the writing operation from the system side. Additionally, the bit line DB for displaying is precharged by the transistor PC which is conductive when signal DR is low. Therefore, the RAM can always be accessed from the system side to the refresh memory without an error in operation at any time, even while the display data is being read.

It is not necessary to state that this invention is not limited to a refresh memory for a display but is also applicable in situations wherein series-parallel conversion is necessary by mutually independent address information.

As stated above, in a seven-element cell in accordance with this invention, the number of transistors is less by three and the number of leads is less by one than in a ten-element cell. Therefore, the area of the cell can be made much smaller in comparison with a ten-element cell. Additionally, there is no limitation in reading the display data, and display data can gain access to the memory from the system side with free timing. Moreover, the area of the cell is made small and the access time is relatively short. Therefore, a memory which is easy to use can be provide because the area of the cells become small and the access time can be made relatively short.

When the circuit of FIG. 2 is a semi-conductor integrated circuit, the parasitic capacity between the output terminal of the inverter 1 and the negative side of the electric power source is larger than the parasitic capacity of the output terminal of the inverter 2, because there is the gate transistor $n_5$. Therefore, the RAM at the time of applying the electric power source can be all-cleared by utilizing the latent image effect without a special circuit.

It will thus be seen that the objects set forth above, among those made apparent from the preceding description, are efficiently attained and, since certain changes may be made in the above construction without departing from the spirit and scope of the invention, it is intended that all matter contained in the above description are shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A semiconductor memory device having a memory cell comprising:
    first and second word selecting lines, said word selecting lines being independent of each other;
    first and second gated transistors having gates commonly driven by said first word selecting line;
    a bi-stable memory element connected between said first and second transistors;
    first, second and third bit lines, said first and second bit lines transmitting mutually inverse data bits for input to said bi-stable memory element through the source/drain terminals of said first and second transistors respectively when said first word selecting line drives said first and second transistor gates;
    a third gated transistor for selectively connecting an output terminal of said bi-stable memory element to said third bit line, said third transistor being selected for outputting data from said bi-stable memory element when driven by said second word selecting line,
    an address selected by said second word selecting line for output of data from said bi-stable memory means being independent of an address selected for input of data to said bi-stable memory element by said first word selecting line.

2. A semiconductor memory device as claimed in claim 1, and further comprising means for prohibiting said first and said word selecting lines from being simultaneously driven.

3. A semiconductor memory device as claimed in claim 2, wherein said means for prohibiting is adapted to prevent said second word selecting line from driving the gate of said third transistor for output when said first word selecting line is driven for input.

4. A semiconductor memory device as claimed in claim 3, wherein said means for prohibiting includes an AND gate, one input to said AND gate being a signal to write data into said bi-stable memory element.

5. A semiconductor memory device as claimed in claim 3, and further comprising latching means, said latching means being adapted to retain data from said third bit line when said second word selecting line is not driven, whereby data is input without interrupting output.

6. A semiconductor memory device as claimed in claim 5, wherein said means for prohibiting includes an AND gate, one input to said AND gate being a signal to write data into said bi-stable memory element.

7. A semiconductor memory device as claimed in claim 6, wherein the output of said gate is adapted to actuate said latching means for retaining data from said third bit line.

8. A semiconductor memory device as claimed in claim 7, wherein said bi-stable memory element comprises first and second inverters connected output to input.

9. A semiconductor memory device as claimed in claim 8, wherein said latching means includes a first tri-state inverter and a third inverter connected output to input, and a second tri-state inverter having its output connected to the input of said third inverter and its input connected to said third bit line, said first and second tri-state inverters being adapted to receive opposite state signals, said latching means being isolated from said third bit line when said means for prohibiting receives a write input.

10. A semiconductor memory device as claimed in claim 1 or 5, and further comprising a plurality of said memory cells, said memory cells being arranged in a matrix of rows and columns, each said row having a common first word selecting line for input, each said column having common first and second bit lines for input, each said column having a common second word selecting line for output, and means for sequentially selecting individual row and column addresses for input and output.

11. A semiconductor memory device as claimed in claim 1 and further comprising latching means adapted to retain data from said third bit line when said second word selecting line is not driven, said latching means includes a first tri-state inverter and a third inverter connected output to input, and a second tri-state inverter having its output connected to the input of said third inverter and its input connected to said third bit line, said first and second tri-state inverters being adapted to receive opposite state signals, said latching means being isolated from said third bit line when said means for prohibiting receives a write input.

* * * * *